US010539625B2

(12) United States Patent
Mueller et al.

(10) Patent No.: US 10,539,625 B2
(45) Date of Patent: Jan. 21, 2020

(54) INTEGRATED STANDARD-COMPLIANT DATA ACQUISITION DEVICE

(71) Applicant: Maxim Integrated Products, Inc., San Jose, CA (US)

(72) Inventors: Bryan A. Mueller, Frisco, TX (US); Erik S. Wheeler, Farmers Branch, TX (US); Mark R. Plagens, Richardson, TX (US); Urs Mader, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 138 days.

(21) Appl. No.: 15/640,459

(22) Filed: Jul. 1, 2017

(65) Prior Publication Data

US 2019/0004117 A1    Jan. 3, 2019

Related U.S. Application Data

(62) Division of application No. 14/371,981, filed as application No. PCT/US2013/021779 on Jan. 16, 2013, now Pat. No. 9,716,520.

(60) Provisional application No. 61/587,122, filed on Jan. 16, 2012, provisional application No. 61/587,108, filed on Jan. 16, 2012, provisional application No. 61/587,113, filed on Jan. 16, 2012.

(51) Int. Cl.
*G01R 31/382* (2019.01)
*G01R 31/36* (2019.01)
*B60L 3/00* (2019.01)

(52) U.S. Cl.
CPC .......... *G01R 31/382* (2019.01); *B60L 3/0046* (2013.01); *G01R 31/3648* (2013.01)

(58) Field of Classification Search
CPC .............. G01R 31/382; G01R 31/3606; G01R 31/3648; B60L 3/0046; B60L 11/1851
See application file for complete search history.

(56) References Cited

U.S. PATENT DOCUMENTS

| 4,695,946 A | 9/1987 | Andreasen et al. |
| 5,804,894 A * | 9/1998 | Leeson ............ G01R 19/16542 307/130 |

(Continued)

FOREIGN PATENT DOCUMENTS

| CN | 102004184 A | 4/2001 |
| CN | 1882843 A | 12/2006 |

(Continued)

*Primary Examiner* — Bryan Bui
(74) *Attorney, Agent, or Firm* — TIPS Group (57) ABSTRACT

An integrated standard-compliant data acquisition device includes an electrically insulating package including a plurality of conductive leads and an integrated circuit (IC) disposed within the electrically insulating package and electrically coupled to at least some of the plurality of conductive leads. The IC includes a first multiplexer (MUX), a second MUX, a third MUX, an analog-to-digital converter (ADC), a plurality of registers, a fourth MUX, control logic, and communication circuitry. In operation, a first circuit value under a first condition can be determined and stored, a second circuit value under a second condition can be determined and stored, and the decision as to whether there is a fault condition can be mad by comparing the first circuit value and the second circuit value.

12 Claims, 4 Drawing Sheets

(56) References Cited

U.S. PATENT DOCUMENTS

| | | |
|---|---|---|
| 2007/0164822 A1 | 7/2007 | Murthy et al. |
| 2008/0061741 A1 | 3/2008 | Yamamoto |
| 2009/0087722 A1 | 4/2009 | Sakabe et al. |
| 2010/0225496 A1 | 9/2010 | Hou et al. |
| 2010/0244847 A1* | 9/2010 | Kudo .................. B60L 3/0046 |
| | | 324/433 |
| 2010/0259221 A1 | 10/2010 | Tabatowski-Bush |
| 2012/0191388 A1* | 7/2012 | Parle ............... G01R 31/31703 |
| | | 702/63 |

FOREIGN PATENT DOCUMENTS

| | | |
|---|---|---|
| CN | 101366176 A | 2/2009 |
| CN | 101399455 A | 4/2009 |
| CN | 101420133 A | 4/2009 |
| CN | 201466159 U | 5/2010 |
| CN | 102231075 A | 11/2011 |
| CN | 102231549 A | 11/2011 |

* cited by examiner

| Fault | Detection Method | Fault Test Frequency |
|---|---|---|
| Package Pin open/short (Pin FMEA) | Contact factory for pin FMEA analysis | |
| Cn Pin Open | Mux Diag | |
| Cn Pin Leakage | Alternate Mux Path | |
| Cell Sense Connection Open | Cell Balancing Switches | |
| Cn short to SWn | Measurement with switch in each position | |
| Balancing Switch Open | Alternate Mux Path | |
| Balancing Switch Shorted | Alternate Mux Path | |
| HVMux Switch Open | Mux Diag | |
| HVMux Switch Shorted | Normal measurement or REF Diag measurement | Diagnostic test during operation |
| LSAmp Offset | LSAmp Zero (Lsamp operation verified by other tests) | or |
| Mux Sequencer | Cell Input Test Sources | Diagnostic circuit check at key-on |
| ADC Data Path | Insert test data into ADC data path | |
| ADC Zero Output | Bias ADC input to force 000h code | |
| ADC Full-Scale Output | Bias ADC input to force FFFh code | |
| ADC Reference Error | REF Diag measurement with independent alternate reference | |
| AUXIN Pin Open | AUXIN Test Sources | |
| Oscillator frequency | Automatic comparison of 32khz oscillator to independent 16Mhz oscillator to verify relationship | |

FIG. 6

INTEGRATED STANDARD-COMPLIANT DATA ACQUISITION DEVICE

CROSS REFERENCE OF RELATED APPLICATIONS

This application is a division of U.S. Ser. No. 14/371,981, filed Jul. 11, 2014, which was the U.S. National Stage International Application No. PCT/US2013/21779, filed Jan. 16, 2013, which claims the benefit of U.S. Ser. No. 61/587,108, U.S. Ser. No. 61/587,113 and U.S. Ser. No. 61/587,122, all filed on Jan. 16, 2012, all of which are incorporated by reference.

FIELD OF THE INVENTION

This invention is related to electronic monitoring systems and more particularly to battery monitoring systems.

BACKGROUND OF THE INVENTION

A battery electric vehicle, or BEV, is a type of electric vehicle (EV) that uses chemical energy stored in rechargeable electric vehicle batteries (EVBs), also known as "battery packs" and "traction batteries." BEVs use electric motors and motor controllers instead of (or in addition to) internal combustion engines for propulsion. A battery-only electric vehicle or all-electric vehicle derives all of its power from its battery packs while a pluggable hybrid electric vehicle derives part of its power from its battery packs and part of its power from an internal combustion engine. Examples of BEVs include automobiles, trucks, golf carts, trains and ships.

Traditional electric vehicle batteries differ from starting, lighting and ignition (SLI) batteries because they are designed to give power over sustained periods of time. Deep cycle batteries are used instead of SLI batteries for these applications. Traction batteries must be designed with a high ampere-hour capacity. Battery packs for BEVs are characterized by their relatively high power-to-weight ratio, energy-to-weight ratio and energy density.

Traction batteries come in several types including, by way of example, lead-acid, nickel metal hydride, and lithium ion traction batteries. Lead acid are generally the cheapest traction batteries available, but have a low energy density. Nickel metal hydride, while being less efficient in charging and discharging than lead acid, have a much greater energy density and can operate well over an extended lifetime (e.g. 10 years of service or 100,000 vehicle miles). Lithium ion batteries have a high energy density, good power density and high charge/discharge efficiency but suffer from short cycle lives and significant degradation with age. New types of lithium ion batteries have been developed that sacrifice energy and power density to provide greater fire resistance, environmental friendliness, rapid charging, and longer lifespans.

Battery pack designs for Electric Vehicles (EVs) are complex and vary widely by manufacturer and specific application. However, they all incorporate a combination of several mechanical and electrical component systems which perform the basic required functions of the pack. Moreover, battery packs incorporate many discrete cells connected in series and parallel to achieve the total voltage and current requirements of the pack. Battery packs can contain several hundred individual cells.

To assist in manufacturing and assembly, the large stack of cells is typically grouped into smaller stacks called modules. Several of these modules will be placed into a single pack. Within each module the cells are welded together to complete the electrical path for current flow. Modules can also incorporate cooling mechanisms, temperature monitors, and other devices. In most cases, modules also allow for monitoring the voltage produced by each battery cell in the stack by a battery management system, or "BMS." The battery pack also contains a variety of other sensors, such as temperature and current sensors, which are monitored by the BMS. BMS can also be responsible for communications with the world outside the battery pack.

When used in battery electric vehicles, the operation of battery packs are currently designed to meet ISO 26262 Functional Safety standards, incorporated herein by reference. Functional Safety is the part of overall safety of a system or piece of equipment that depends upon the system or equipment operating correctly in response to inputs, including the safe management of likely operator errors, hardware failures and environmental changes. The ISO 26262 Functional Safety standard is entitled "Road vehicles—Functional safety", and is an adaption of the Functional Safety standard ICE61508 for Automotive Electric/Electronic Systems, incorporated herein by reference.

The circuitry of certain BMS devices has been integrated into integrated circuits (ICs). To meet ISO26262 safety requirements related to automotive products and customer system reliability goals, it is necessary to diagnose failures within the IC and the application circuit that affect the safety goal of the application. These failures must be detected within the fault tolerant time of the voltage sources being monitored (various battery types, supercaps and fuel cells primarily).

Safety Integrity Level (SIL) is defined as a relative level of risk reduction provided by a safety function, or to specify a target level of risk reduction. IEC61508 provides for Safety Integrity Levels. ISO26262 provides a framework for Automotive Safety Integrity Levels (ASILs). ASIL ratings are A, B, C, or D, with D being the highest end of the A-D scale. Safety is very important in battery electric vehicle applications due to the chemicals, high voltages and high energy of battery packs and because of the potential for fire and/or explosion caused by the improper operation or failure of battery packs.

An important aspect of the ASIL standard is to monitor for failure both in the battery pack and in the devices monitoring the battery pack. For example, the cells are monitored for an over-voltage condition which could cause fires and/or the release of noxious fumes. However, if the monitoring device itself fails or malfunctions, dangerous conditions with respect to the battery pack can be missed.

One way of addressing the problem of the failure of a monitoring device is redundancy. For example, multiple battery pack monitoring devices can be used in parallel to monitor the health of a battery pack. The outputs of the multiple monitoring devices can be compared and if they are the same it can be assumed with some degree of certainty that the monitoring devices are working properly. However, if the outputs of the multiple monitoring devices are different, it can be assumed that one or more of the monitoring devices are not working properly and a "fault" condition can be initiated.

A problem with using multiple monitoring devices is cost and system complexity. Also, the nature of a fault condition is not known in that the system only knows that one or more of the redundant monitoring devices is not working properly. These and other limitations of the prior art will become apparent to those of skill in the art upon a reading of the following descriptions and a study of the several figures of the drawing.

SUMMARY OF THE INVENTION

Various examples are set forth herein for the purpose of illustrating various combinations of elements and acts within the scope of the disclosures of the specification and drawings. As will be apparent to those of skill in the art, other combinations of elements and acts, and variations thereof, are also supported herein.

An integrated standard-compliant data acquisition device, set forth by way of example and not limitation, includes an electrically insulating package including a plurality of conductive leads and an integrated circuit (IC) disposed within the electrically insulating package and electrically coupled to at least some of the plurality of conductive leads. In an embodiment the IC includes a first multiplexer (MUX), a second MUX, a third MUX, an analog-to-digital converter (ADC), a plurality of registers, a fourth MUX, control logic, and communication circuitry. The third MUX has, as inputs, outputs of the first MUX and the second MUX and the ACD is coupled to the output of the third MUX in this example. The fourth MUX has, as inputs, the output of the ADC and the plurality of registers and an output connected to control logic of the IC. The communication circuitry, in this non-limiting example, is coupled to the plurality of registers for both reading and writing. In an alternate embodiment, inputs to the second MUX are also coupled to balancing switches for a battery pack.

An ISO-26262 compliant battery monitoring system, set forth by way of example and not limitation, includes a first multiplexer (MUX), a second MUX, a plurality of balancing switches, a third MUX, an analog-to-digital converter (ADC) and a data register. In this example, the first MUX has a first plurality of inputs coupled to a plurality of battery cells with a plurality of filter resistors, and a first MUX output. The second MUX has a second plurality of inputs coupled to the plurality of battery cells with a plurality of balance resistors, and a second MUX output. The balancing switches are coupled between adjacent pairs of the balance resistors. The third MUX has inputs coupled to the first MUX output and the second MUX output and has a third MUX output. The ADC has an analog input coupled to the third MUX output and a digital output, and the data register is coupled to the ADC.

A method for battery monitoring, set forth by way of example and not limitation, includes determining and storing a first circuit value of a circuit under a first condition, determining and storing a second circuit value under a second condition, and determining whether there is a fault by comparing the first circuit value and the second circuit value. In this example, a type of fault can be determined when the first circuit value differs from the second circuit value by more than the tolerance level. In an alternate embodiment, the method further includes balancing cells of a battery based, at least in part, from the first circuit value.

An advantage of embodiments of the integrated standard-compliant data acquisition device is that a single device can be used to detect faults, as opposed to the plurality of redundant devices required of prior art solutions. A further advantage of certain example embodiments is faults internal to the device can be determined. Also, the type of fault can be determined and ranked as to severity in certain example embodiments.

These and other examples of combinations of elements and acts supported herein as well as advantages thereof will become apparent to those of skill in the art upon a reading of the following descriptions and a study of the several figures of the drawing.

BRIEF DESCRIPTION OF DRAWINGS

Several examples will now be described with reference to the drawings, wherein like elements and/or acts are provided with like reference numerals. The examples are intended to illustrate, not limit, concepts disclosed herein. The drawings include the following figures.

DETAIL DESCRIPTION OF THE INVENTION

Figure 1:
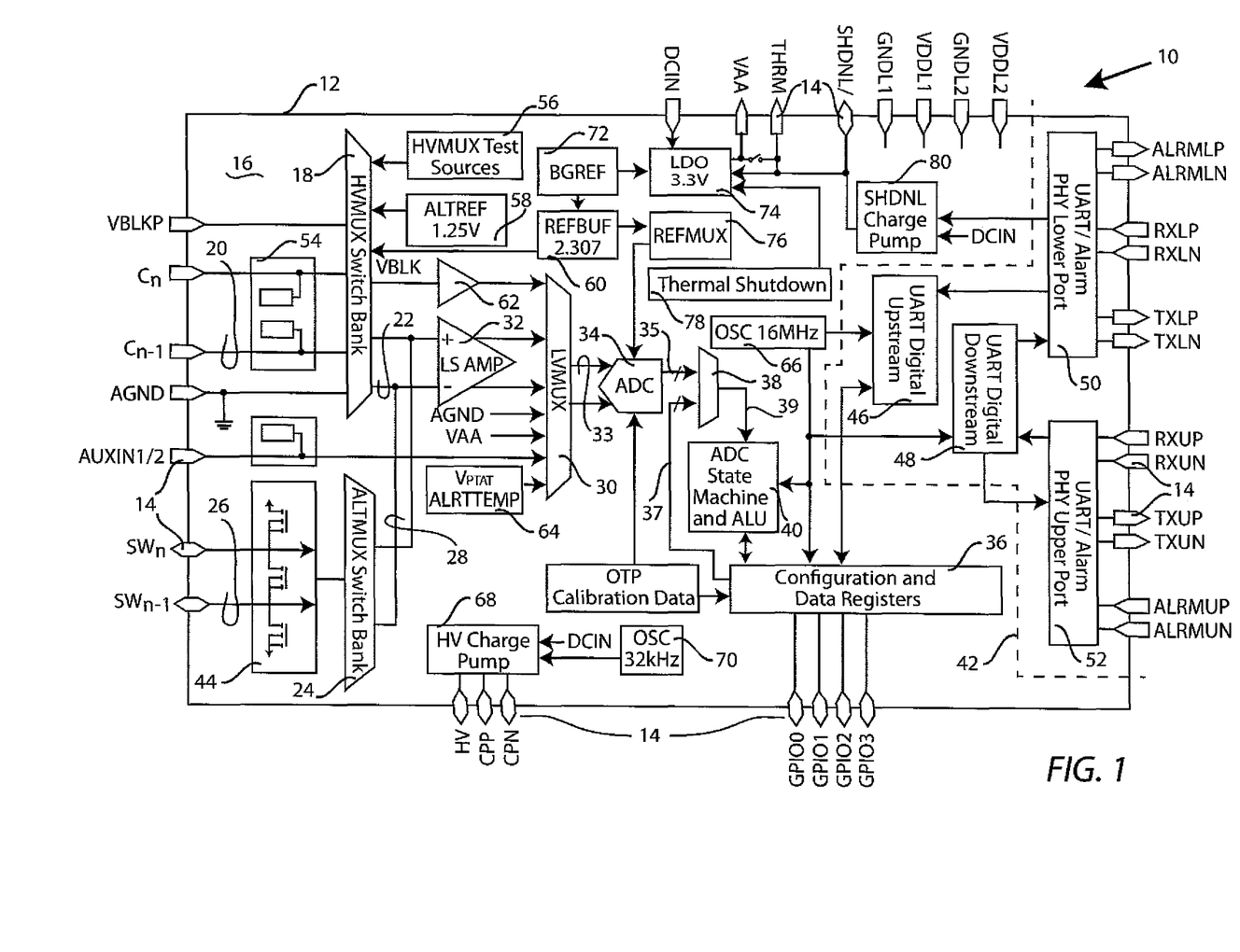
FIG. 1 is a block diagram of an example integrated standard-compliant data acquisition device.

FIG. 1 illustrates, by way of example and not limitation, an integrated standard-compliant data acquisition device 10 including an electrically insulating package 12 including a plurality of conductive leads 14, and an integrated circuit (IC) 16 disposed within the package 12 and electrically coupled to at least some of the leads 14. In this example, the IC 16 includes a first multiplexer (MUX) 18 having a first plurality of inputs 20 and a first MUX output 22, a second MUX 24 having a second plurality of inputs 26 and a second MUX output 28, a third MUX 30 having inputs coupled to the first MUX output and to the second MUX output by an LS amplifier 32 and having a third MUX output 33, an analog-to-digital converter (ADC) 34 having an analog input coupled to the third MUX output 33 and a digital output, a plurality of registers 36, a fourth MUX 38 having inputs coupled to the digital output of the ADC 34 and the plurality of registers 36, control logic 40 coupled to the output of the fourth MUX 38, and communication circuitry 42 coupled to the plurality of registers 35.

In the non-limiting example of FIG. 1, device 10 is configured as an ISO-26262 compliant battery monitoring device. As such, it monitors and detects both external and internal faults, e.g. open external sense lines attached to the second plurality of inputs 26, faulty components and/or functional blocks of IC 16, overheating conditions, etc. In addition, in this non-limiting example, cell balancing switches 44 share the second plurality of inputs 26. Furthermore, communication circuitry 42 in this non-limiting example includes Universal Asynchronous Receiver/Transmitter (UART) circuitry including UART digital upstream 46, UART digital upstream 48, UART/alarm PHY lower port 50 and UART/alarm PHY upper port 52.

In this non-limiting example, first MUX 18 is a high-voltage (HV) MUX switch bank. The first plurality of inputs 20 are lines $C_0$-$C_n$ which are coupled to n cells of a battery pack (not shown). For example, with a battery pack having 12 cells, there are 13 lines $C_0$-$C_{12}$. In this example, current sources 54 are coupled to each of the inputs 20 for testing purposes. The first MUX 18 also has, as inputs, VBLKP (the total voltage of the battery pack), AGND (the ground of the battery pack) and additional test inputs including HVMUX test current sources HVMUX 56, alternative reference voltage ALTREF 58, and reference voltage REFBUF 60. The first MUX 18 also has an output of the battery pack voltage VBLK with is coupled to an input of third MUX 30 by a buffer 62.

Second MUX 24, in this example, is an alternative HV switch bank ALTMUX. The second plurality of inputs 26 are sense lines $SW_0$-$SW_n$, which are coupled to corresponding cells of the battery pack as lines $C_0$-$C_n$. Therefore, lines $SW_0$-$SW_n$ provide a second measurement path for the voltage of the cells of the battery pack with respect to the first measurement path of lines $C_0$-$C_n$. As will be discussed subsequently, this allows a measurement of the cell voltages of the battery pack (not shown) under a plurality of conditions which allows for the detection of faults such as open sense lines.

In this example, third MUX 30 is a low-voltage (LV) MUX, where the voltage level of the first MUX 18 is reduced by LS amplifier 32. It should be noted that the control logic 40 controls first MUX 18 and second MUX 24 so that only one applies an output voltage to the input of LS amplifier 32 at any one time. The third MUX 30 has other test inputs including AGND, VAA and a VPTAT voltage input ALRTTEMP 64.

ADC 34 has a differential input coupled to third MUX output 33 and a digital output on a bus 35. For example, bus 35 can be a 12 bit bus providing a 12 bit digital representation of the differential voltage on the third MUX output 33 lines. The bus 35 comprises one digital input into fourth MUX 38 and a bus 37 (also 12 bits in this non-limiting example) from the plurality of registers 38 comprises another digital input to fourth MUX 38. MUX 38 selections one of busses 35 and 37 for an output bus 39 (also 12 bits in this non-limiting example) which inputs into control circuitry 40. Fourth MUX 38 allows measured voltages from ADC 34 to be input into control logic 40 in a first condition and data from the plurality of registers 36 to be input into control logic 40 in a second condition.

Much of the communication with respect to IC 16 occurs via the plurality of registers 36 which include configuration and data registers. That is, data can be written to registers as the result of a measurement, or to provide configuration data, or to provide test data, and data can be read from the registers to provide outputs, controls, test data, etc. An oscillator OSC 66 (16 MHz in this non-limiting example), provides timing clocks for the plurality of registers 36 as well as the control logic 40 and communication circuitry 42.

Control logic 40 controls much of the timing and operation of IC 16. In addition, control logic 40 both reads and writes to the plurality of registers 36. In this non-limiting example, control logic 40 is implemented as a state machine and arithmetic logic unit (ALU). It will be appreciated by those of skill in the art that the control logic can be implemented in other ways, including discrete logic, microcontroller, etc.

In this non-limiting example, IC 16 can include additional components for operation and/or testing. For example, a high voltage (HV) charge pump 68 having inputs of DCIN and a 32 kHz clock 70 can be provided. Clocks 66 and 70 can be compared as another fault test. A bandgap reference 72 can be input into REFBUF 60 and to an LDO 74. A buffer reference voltage REFMUX 76 can have, as an input, REFBUF 60 and provide a reference voltage to ADC 34. A thermal shutdown alarm 78 can be input into the LDO 74 as well as a charge pump SHDNL 80.

The integrated standard-compliant data acquisition device 10, in this non-limiting example, communicates with an external processor via communication circuitry 42. More particularly, in this example, the IC 16 communicates with the external processor using the plurality of registers 36, where the external processor both reads from the registers 36 and writes to the registers 36.

It will therefore be appreciated that the integrated standard-compliant data acquisition device 10 can be used as part of an ISO-26262 compliant battery monitoring system. This is accomplished by determining and storing a first circuit value under a first condition, determining and storing a second circuit value under a second condition, and determining whether there is a fault by comparing the first circuit value and the second circuit value. For example, circuit values can be voltage levels, test parameters, etc. The first and second conditions can also include comparing circuit values taken through different paths (e.g. from inputs 20 as compared to from inputs 26), or by comparing alternate sources such as REFBUF 60 and ALTREF 58, by comparing ADC 34 values on bus 35 against test values on bus 37 that are stored in registers 36, etc. In this way, both external components coupled to the integrated standard-compliant data acquisition device 10 and internal components of the integrated standard-compliant data acquisition device 10 can be monitored for fault conditions up to ASIL standards. Furthermore, by identifying the type of fault, the faults can be ranked by order of importance ranging from a minor fault condition to a critical fault condition. In this way, the system can take appropriate action dependent upon the severity of the fault condition.

Figure 2:
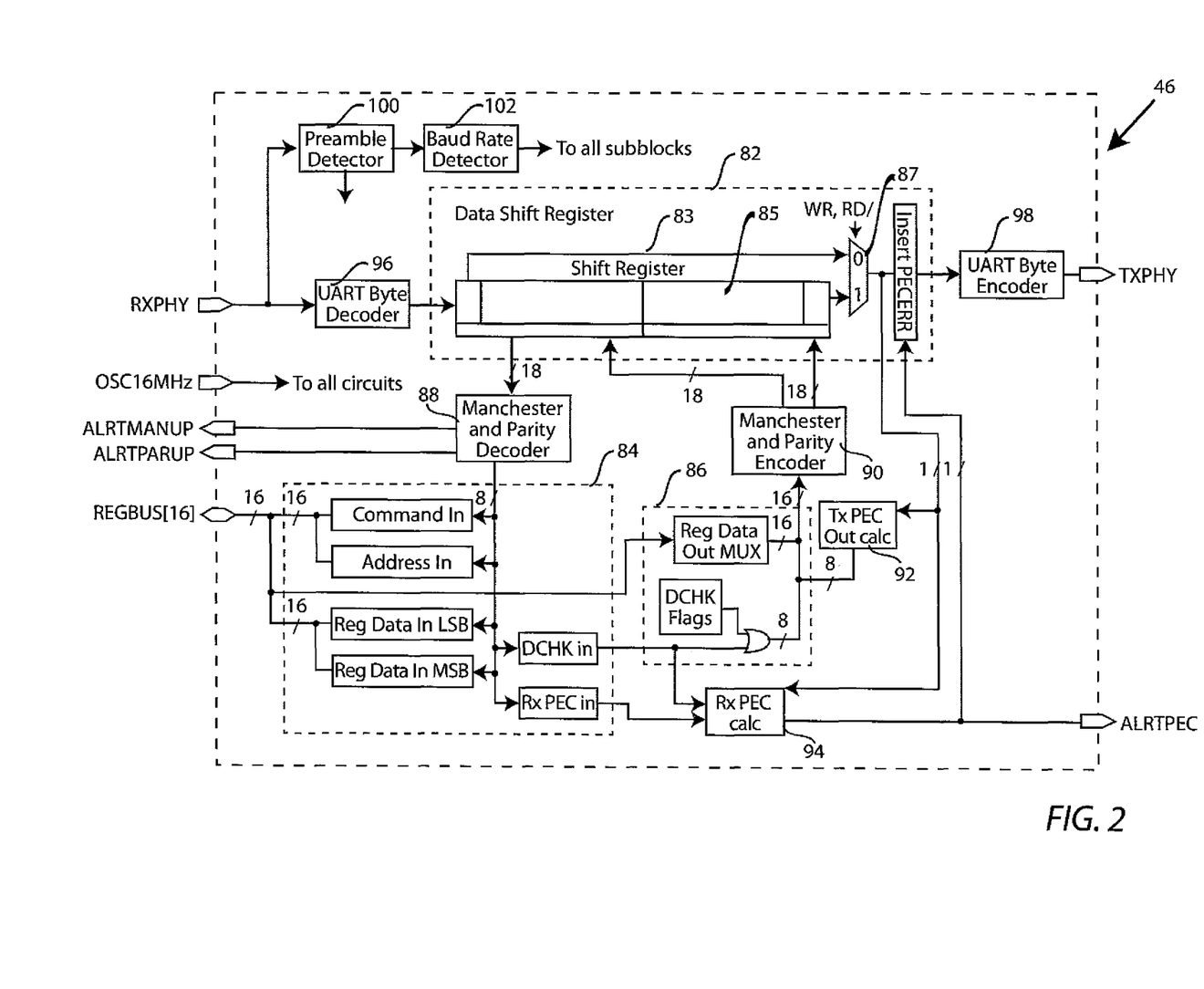
FIG. 2 is a more detailed block diagram of the UART digital upstream 46 of FIG. 1.

FIG. 2 illustrates, by way of example and not limitation, a UART digital upstream circuit 46 of FIG. 1. The UART digital upstream 46 includes a first-in-first-out (FIFO) shift register 82, an incoming data decoder 84, an outgoing data decoder 86, a Manchester and parity decoder 88, a Manchester and parity encoder 90, a TX PEC Output Calculator 92, and RX PEC Calculator 94, a UART byte decoder 96, a UART byte encoder 98, a preamble detector 100 and a baud rated detector 102. Bus REGBUS [16] and lines ALRT-MANUP, ALRTPARUP and ALRTPEC are coupled to the plurality of registers 36 (see FIG. 1).

With continuing reference to FIG. 2, there are two types of commands that may be flowing through shift register 82 from an external processor, namely a write command and a read command. The write command, in this present non-limiting example is the external processor writing to the registers 36 and a read command is the external processor reading from the registers 36, both of which are accomplished through the communication circuitry 42.

As data comes in from the receiving PITY (RXPHY) it is decoded in UART byte decoder 96 and is serially input into the shift register 82. The RX PEC calculation 94 continuously samples the data and, ultimately, the received calculated PEC is compared to the PEC received from the previous device.

As noted, the shift register 82 there are two paths: one for write commands and one for read commands. Since a write command is intended to pass through unchanged, it bypasses the shift register as shown at 83 in its entirety. A read command includes write bytes and read bytes, and the read bytes (the second half of the read command) go through the shift register blocks 85. The data stream is reunited in a MUX 87.

The read commands and write commands are continuously sampled by the shift register 82. The calculated PECs and the received PECs are compared. For write commands, the two PECs should be the same (i.e. the calculated TX PEC out calculation 92 should come up with the same PEC as the received write command. For read commands, the newly calculated PEC that will be transmitted (TxPEC) will almost always be different than the received PEC because additional data is typically added by the device. However, the calculated RxPEC is used to mask out any new data introduced by the device (e.g. using MUX 87) so that the comparison will ultimately be based only on the originally received data. In consequence, the calculated RxPEC should match the received PEC if there is no error.

By using the transmitted data to calculate the expected received PEC several logic components, including shift register 85, are verified. Any error introduced while data is traversing the shift register will be observable in the mismatched calculated RxPEC as compared to the received PEC. This approach adds a level of self checking that would not be present if the RXPEC is calculated based on UART Byte Decoder 96 output.

Figure 3:
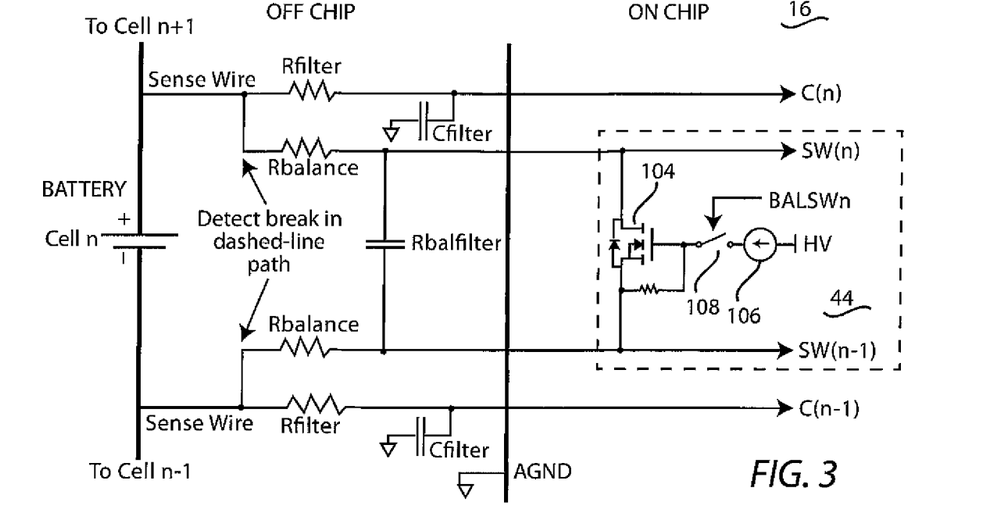
FIG. 3 is schematic diagram illustrating an operation of a cell balancing switch of block 44 of FIG. 1.

FIG. 3 illustrates the operation of cell balancing switches 44 of FIG. 1. In this example, a plurality of battery cells n are coupled in series, and inputs C(n−1) and C(n) are coupled across battery cell n by resistors $R_{filter}$. Likewise, inputs SW(n−1) and SW(n) are coupled across the battery cell n by resistors $R_{balance}$. A MOSFET switch 104 is activated by a current source 106 under the control of a signal BALSWn on a switch 108. When activated, the MOSFET switch 104 bypasses the cell n via the two resistors $R_{balance}$ to balance out the cells of the battery pack (e.g. to have cells at optimal voltage levels). Advantageously, the inputs C(n) and C(n−1) and the inputs SW(n) and SW(n−1) provide redundant connections to the cell n, such that breaks in the wires going to the cell n can be detected.

Figures 4, 5:
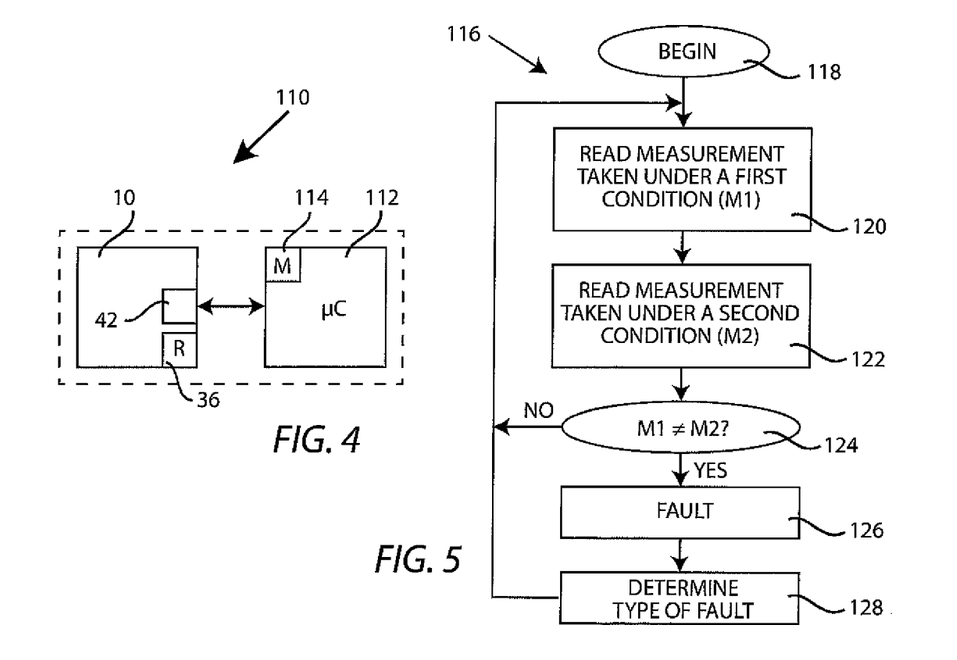
FIG. 4 is a block diagram of an example integrated standard-compliant data acquisition system.
FIG. 5 is a flow diagram of a process for determining fault with an integrated standard-compliant data acquisition system of FIG. 4.

FIG. 4 is a block diagram of an example integrated standard-compliant data acquisition system 110 including an integrated standard-compliant data acquisition device 10 and a processor 112. In this example embodiment, the integrated standard-compliant data acquisition device is shown as a separate component from processor 112, but in alternate embodiments processor 112 may be incorporated within the integrated standard-compliant data acquisition device 10 or vice versa.

In this example embodiment, processor 112 includes memory 114 and communicates with integrated standard-compliant data acquisition device 10 via its communication circuitry 42 by reading and writing to registers 36. In other embodiments, processor 112 and integrated standard-compliant data acquisition device 10 can communicate in different fashions. The memory 114 of processor 112 can include code segments executable by the processor to, for example, generate read and write commands for the integrated standard-compliant data acquisition device 10.

FIG. 5 is a flow diagram, set forth by way of example and not limitation, of a process 116 for determining fault with the integrated standard-compliant data acquisition system of FIG. 4. Process 116 can be implemented, by way of non-limiting example, with code segments stored in memory 114 and executable by processor 112.

Process 116 begins at 118 and, in an operation 120, a measurement (M1) that was taken under a first condition is read from, for example, from registers 36. Next, in an operation 122, a measurement (M2) that was taken under as second condition is read, for example, from registers 36. The measurement M1 is then compared to the measurement M2 in an operation 124 and, if they are not unequal (e.g. if they are substantially the same within a tolerance level), then process control returns to operation 120. If operation 124 determines that M1≠M2, operation 126 signals a fault condition, and an optional operation 128 determines the type of fault. The process then returns to operation 120 to continuing the fault monitoring process 116.

Figure 6:
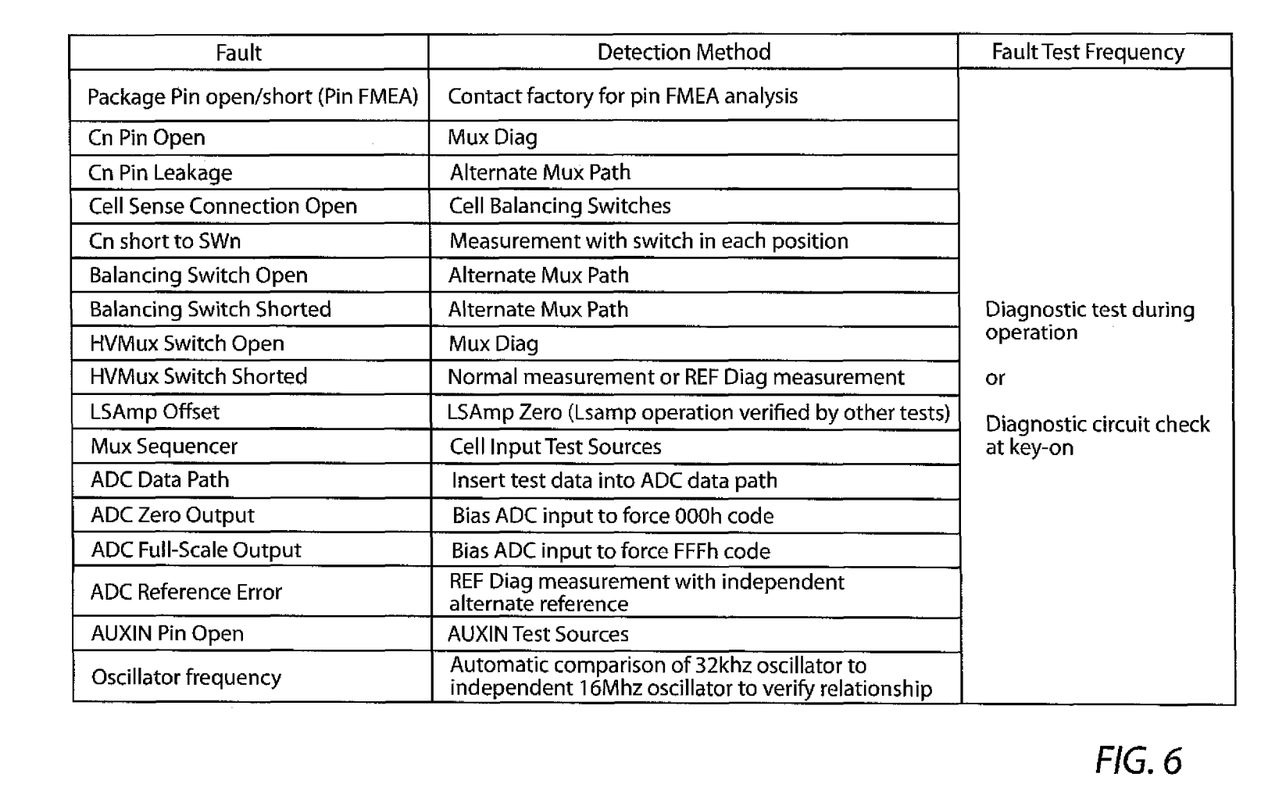
FIG. 6 is a table of example faults and detection methods for an integrated standard compliant data acquisition system of FIG. 4.

FIG. 6 is a table of example analog diagnostic checks. The first column lists the fault type, the second column lists an associated detection method, and the third column lists a recommended test frequency. By way of non-limiting example, a measurement can be taken with integrated standard-compliant data acquisition device 10 and then a diagnostic can be executed to confirm that the measurement was accurate. As will be appreciated by those of skill in the art, digital diagnostics can be obtained using digital test patterns.

A number of useful tests and measurements may be made with the integrated standard-compliant data acquisition device 10. For example, the integrated standard-compliant data acquisition device 10 can provide cell overvoltage condition generation. That is, by way of non-limiting example, the internal cell balancing switches 44 may be used to generate a voltage up to 2*Vcell at the second MUX 24 inputs to test the measurement circuit input range capability. By generating and measuring this elevated voltage on the second MUX 24 path, the measurement path dynamic range can be verified. Then, by comparing the nominal measured values through the second MUX 24 path to the first MUX 18 input path measurements, the primary path measurement is validated.

In this example, a cell position input voltage is elevated by approximately 1.5*Vcell turning on either of the adjacent balance switches 104 (which, for a cell n, we will refer to herein as BALSW(n+1) or BALSW(n−1)). When the adjacent switch (BALSW) is turned on, the SW pin shared with the switch is moved by 0.5*Vcell, which causes cell(n) to increase by that amount when measured with the second MUX 24 path. For the topmost cell position, BALSW(n−1) can be used and for the bottom cell position BALSW(n+1) can be used. By turning on two adjacent switches instead of one, such as BALSW(n+1) and BALSW(n+2), the measured voltage is approximately 2*Vcell assuming all cells are at approximately the same voltage.

Using this technique, a measurement voltage that exceeds the overvoltage threshold for a cell is generated to test the measurement path and overvoltage handling functions of the system except when the cell is at or near its lowest discharge condition. In all cases, it is possible to verify the measurement system input headroom is not limited. The measurement path input headroom may also be verified by using the Cell Test Current Sources to generate a small positive voltage change in the primary measurement path for a selected set of cell positions. If the expected voltage change is verified by measurement.

Although various examples have been described using specific terms and devices, such description is for illustrative purposes only. The words used are words of description rather than of limitation. It is to be understood that changes and variations may be made by those of ordinary skill in the art without departing from the spirit or the scope of any examples described herein. In addition, it should be understood that aspects of various other examples may be interchanged either in whole or in part. It is therefore intended that the claims herein and hereafter presented be interpreted in accordance with their true spirit and scope and without limitation or estoppel.

What is claimed is:

1. A non-transitory computer readable medium including code segments executable by a processor comprising:
   (a) code segments obtaining a first circuit value under a first condition;
   (b) code segments obtaining a second circuit value under a second condition;
   (c) code segments comparing the first circuit value and the second circuit value and determining that there is a fault when the first circuit value differs from the second circuit value by more than a tolerance level;
   (d) code segments determining a type of the fault when step (c) determines that there is a fault; and
   (e) code segments repeating steps (a) (e);
   wherein faults are ranked by order of importance; and
   wherein the ranking of the faults range from a minor fault condition to a critical fault condition.

2. A non-transitory computer readable medium including code segments executable by a digital processor as recited in claim 1 wherein the processor includes memory storing the code segments.

3. A non-transitory computer readable medium including code segments executable by a digital processor as recited in claim 2 wherein the processor forms a part of an integrated standard-compliant data acquisition system.

4. A non-transitory computer readable medium including code segments executable by a digital processor as recited in claim 3 where the integrated standard-compliant data acquisition system further includes an integrated standard-compliant data acquisition device.

5. A non-transitory computer readable medium including code segments executable by a digital processor as recited in claim 4 wherein the integrated standard-compliant data acquisition device includes communication circuitry and registers.

6. A non-transitory computer readable medium including code segments executable by a digital processor as recited in claim 5 wherein the processor communicates with the integrated standard-compliant data acquisition device via its communication circuitry by reading and writing to the registers.

7. A non-transitory computer readable medium including code segments executable by a digital processor as recited in claim 6 wherein code segments obtain the first circuit value by reading the first circuit value from the registers.

8. A non-transitory computer readable medium including code segments executable by a digital processor as recited in claim 7 wherein code segments obtain the second circuit value by reading the second circuit value from the registers.

9. A non-transitory computer readable medium including code segments executable by a digital processor as recited in claim 4 wherein the first circuit value and the second circuit value are voltage levels.

10. A non-transitory computer readable medium including code segments executable by a digital processor as recited in claim 4 wherein the first circuit value and the second circuit value are test parameters.

11. A non-transitory computer readable medium including code segments executable by a digital processor as recited in claim 4 wherein the first condition and the second condition include taking different paths in the integrated standard-compliant data acquisition device.

12. A non-transitory computer readable medium including code segments executable by a digital processor as recited in claim 4 wherein the fault is determined to be a cell overvoltage condition.

* * * * *